(12) United States Patent
Todoroki et al.

(10) Patent No.: US 11,105,566 B2
(45) Date of Patent: Aug. 31, 2021

(54) HEAT EXCHANGER, HEAT EXCHANGE SYSTEM, AND HEAT EXCHANGE METHOD

(71) Applicant: NEC Corporation, Tokyo (JP)

(72) Inventors: Koichi Todoroki, Tokyo (JP); Arihiro Matsunaga, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 67 days.

(21) Appl. No.: 16/498,073

(22) PCT Filed: Mar. 30, 2017

(86) PCT No.: PCT/JP2017/013175
§ 371 (c)(1),
(2) Date: Sep. 26, 2019

(87) PCT Pub. No.: WO2018/179198
PCT Pub. Date: Oct. 4, 2018

(65) Prior Publication Data
US 2020/0103183 A1 Apr. 2, 2020

(51) Int. Cl.
*F28D 9/02* (2006.01)
*F28F 9/02* (2006.01)
*F28D 7/00* (2006.01)

(52) U.S. Cl.
CPC ............ *F28F 9/02* (2013.01); *F28D 7/0066* (2013.01)

(58) Field of Classification Search
CPC .. F28D 1/05391; F28D 7/0066; F28F 9/0214; F28F 9/02; F25B 49/027
USPC ...................................................... 165/175
See application file for complete search history.

(56) References Cited

U.S. PATENT DOCUMENTS

| 5,101,640 A * | 4/1992 | Fukushima ........... F25B 49/027 62/196.4 |
| 2004/0159121 A1* | 8/2004 | Horiuchi ............... F28F 9/0214 62/526 |
| 2007/0131393 A1* | 6/2007 | Sasaki ................. F28D 1/05391 165/110 |

FOREIGN PATENT DOCUMENTS

| JP | 6-323691 A | 11/1994 |
| JP | 7-305919 A | 11/1995 |
| JP | 11-89213 A | 3/1999 |
| JP | 2001-280751 A | 10/2001 |
| JP | 2006-266563 A | 10/2006 |
| JP | 2008-528935 A | 7/2008 |
| JP | 2010-519743 A | 6/2010 |
| JP | 2016-80262 A | 5/2016 |
| JP | 2017-33427 A | 2/2017 |
| JP | 2017-050449 A | 3/2017 |

(Continued)

OTHER PUBLICATIONS

International Search Report for PCT/JP2017/013175 dated Jun. 27, 2017 [PCT/ISA/210].

*Primary Examiner* — Davis D Hwu
(74) *Attorney, Agent, or Firm* — Sughrue Mion, PLLC

(57) ABSTRACT

The present invention provides a heat exchanger including a lower header into which a liquid-phase refrigerant flows, a plurality of heat exchange pipes which branch off from the lower header and extend upwards, and an upper header which is configured to collect refrigerant received by the heat exchange pipes, in which a refrigerant inlet of the lower header is provided with a flow passage resistance adjusting hole having a cross-section smaller than a flow passage cross-section of a pipe passage for supplying the refrigerant.

10 Claims, 6 Drawing Sheets

(56) References Cited

FOREIGN PATENT DOCUMENTS

WO 2015/087530 A1 6/2015
WO 2016/152111 A1 9/2016

* cited by examiner

HEAT EXCHANGER, HEAT EXCHANGE SYSTEM, AND HEAT EXCHANGE METHOD

CROSS REFERENCE TO RELATED APPLICATIONS

This application is a National Stage of International Application No. PCT/JP2017/013175, filed on Mar. 30, 2017.

TECHNICAL FIELD

The present invention relates to a heat exchanger, a heat exchange system, and a heat exchange method for efficiently receiving heat from electronic equipment.

BACKGROUND ART

A data center in which a large number of pieces of electronic equipment are densely arranged is provided with a heat exchange system which allows heat radiation to be performed by using a phase change cycle of evaporation and condensation of a refrigerant in order to secure a capacity to discharge the large amount of heat generated by the electronic equipment.

As such a heat exchange system, a technique for distributing and supplying a refrigerant liquid to a multistage heat receiver disclosed in, for example, Patent Document 1 and receiving heat from electronic equipment with a plurality of heat receivers has become known.

An air conditioning apparatus disclosed in Patent Document 1 has a configuration in which one outdoor unit serving as a heat radiating unit and a plurality of indoor units (heat receiving units) connected to the outdoor unit through a pipe are provided and a flow division device is provided in the middle of the pipe connecting outdoor unit and the indoor each other.

Further, in such a flow division device, a flow of a refrigerant can be divided while compensating for a difference in the height of the heat receiving unit and a difference in a pipe pressure loss by adjusting a pressure loss on an outlet side of the flow division device at the time of installation of the flow division device.

CITATION LIST

Patent Document

[Patent Document 1]
Japanese Unexamined Patent Application, First Publication No. 2006-266563

SUMMARY OF INVENTION

Technical Problem

However, the flow division device of the air conditioning apparatus disclosed in Patent Document 1 is positioned between the heat radiating unit and the heat receiving unit and thus needs an installation space therefor, which results in a disadvantage that the whole configuration may be larger.

The present invention is contrived in view of such situations and provides a heat exchanger and a heat exchange system which are capable of achieving space saving as a whole while achieving an improvement in heat removal performance in a heat exchange pipe by applying resistance to a liquid-phase refrigerant supplied to the heat exchange pipe serving as a heat receiver without using a flow division device having a particular structure.

Solution to Problem

In order to solve the above-described problem, the present invention proposes the following means.

According to a first aspect of the present invention, there is provided a heat exchanger including a lower header into which a liquid-phase refrigerant flows, a plurality of heat exchange pipes which branch off from the lower header and extend upwards, and an upper header which is configured to collect refrigerant received by the heat exchange pipes, in which a refrigerant inlet of the lower header is provided with a flow passage resistance adjusting hole having a cross-section smaller than a flow passage cross-section of a pipe passage for supplying the refrigerant.

According to a second aspect the present invention, there is provided a heat exchange method including supplying quid-phase refrigerant to a plurality of heat exchange pipes branching off from a lower header, and collecting refrigerant received by the heat exchange pipes in an upper header, in which a pressure of the refrigerant is lowered when the refrigerant flows into the lower header.

Advantageous Effects of Invention

According to the present invention, it is possible to improve heat removal performance in a heat receiver by causing a drop in pressure on a downstream side of a flow passage resistance adjusting hole to lower a boiling point of a refrigerant liquid.

Further, in the present invention, it is possible to achieve space saving, as whole by installing the flow passage resistance adjusting hole in a refrigerant inlet within a lower header.

Figure 4:
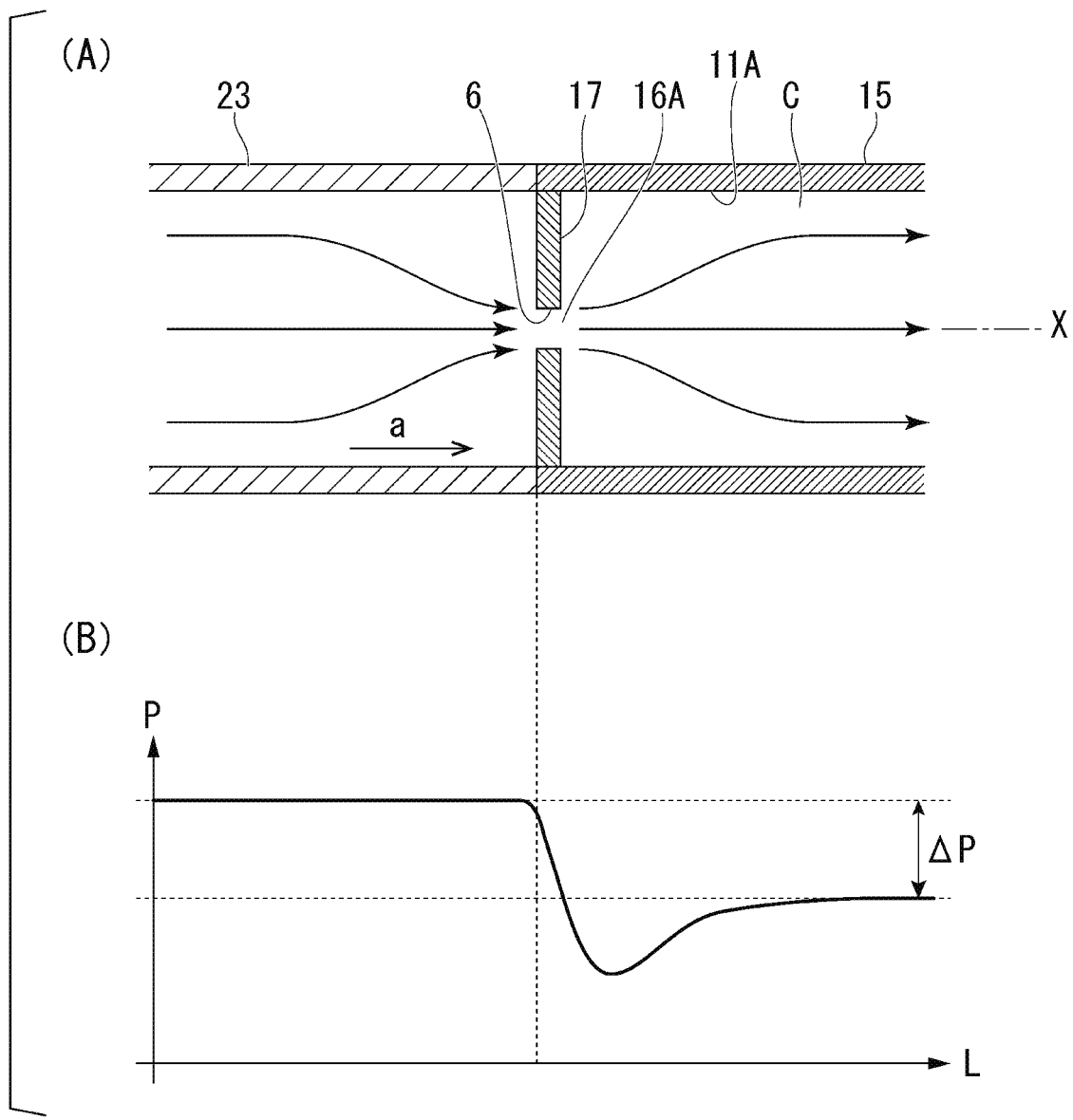

Part (A) of FIG. 4 is a cross-sectional view showing a flow passage resistance adjusting hole according to the present invention, and part (B) of FIG. 4 is a graph showing a relationship between a hole position and a refrigerant pressure.

Figure 5:
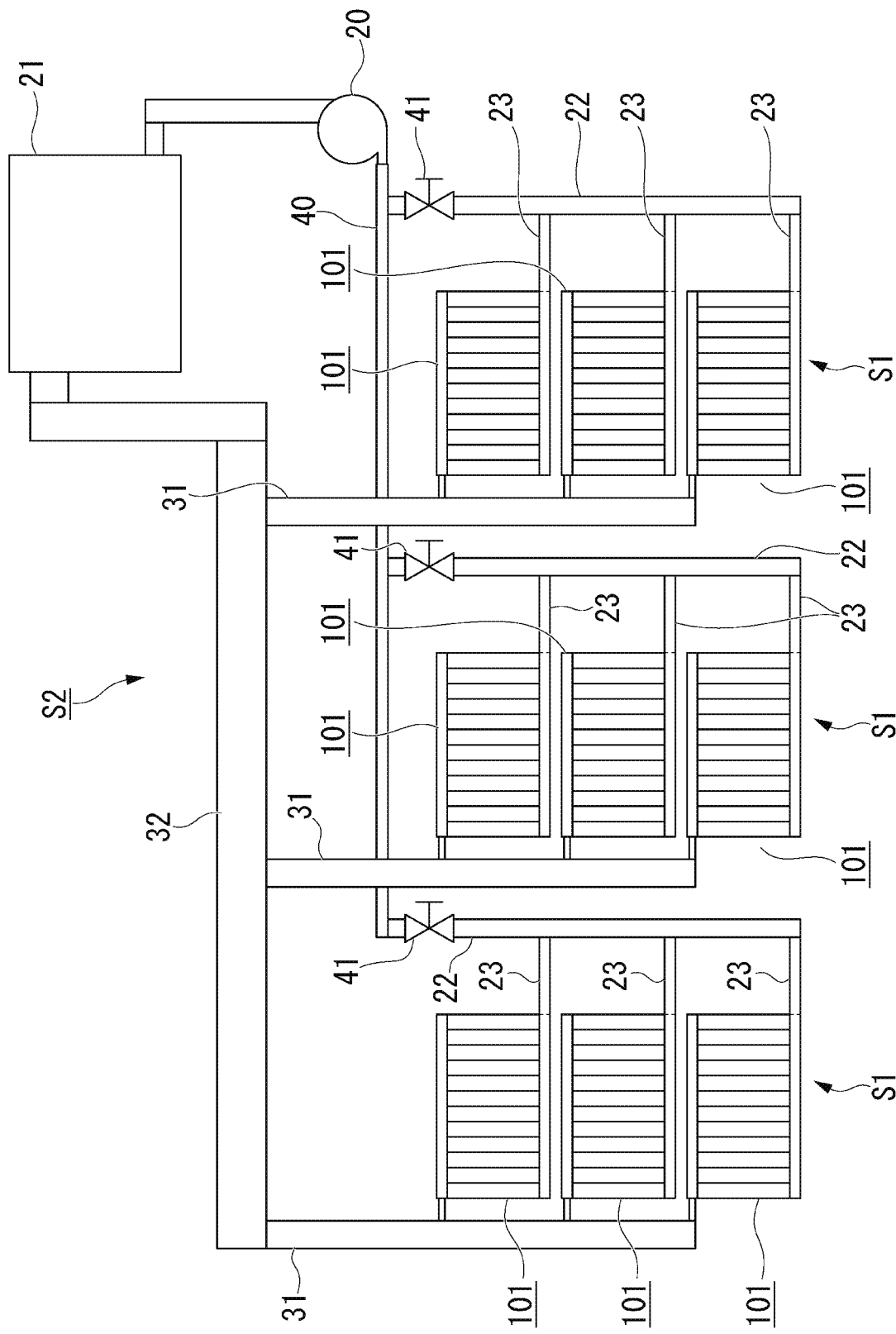

FIG. 5 is a schematic configuration diagram of a heat exchange system according to a second embodiment of the present invention.

Figure 6:
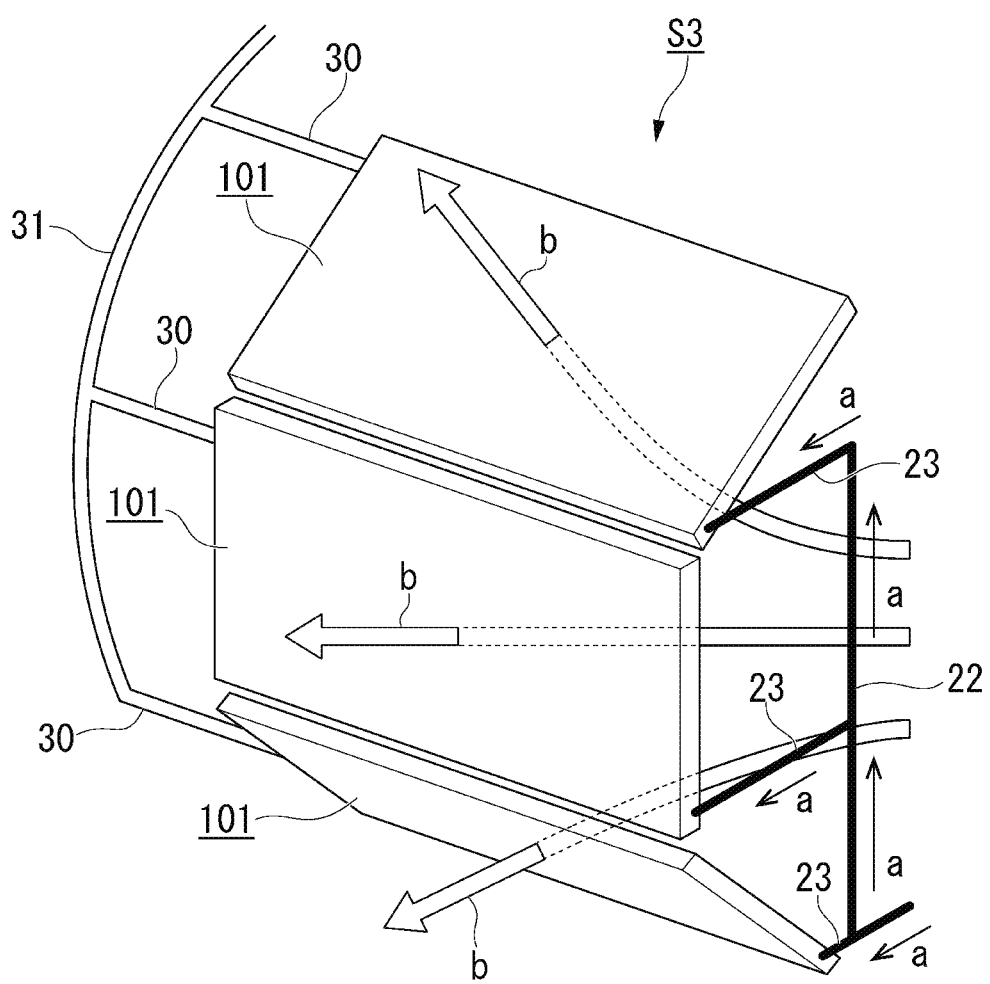

FIG. 6 is a schematic configuration diagram of a heat exchange system according to a third embodiment of the present invention.

DESCRIPTION OF EMBODIMENTS

A heat exchanger 100 according to a minimum configuration of the present invention will be described with reference to FIGS. 1A and 1B.

Figure 1A:
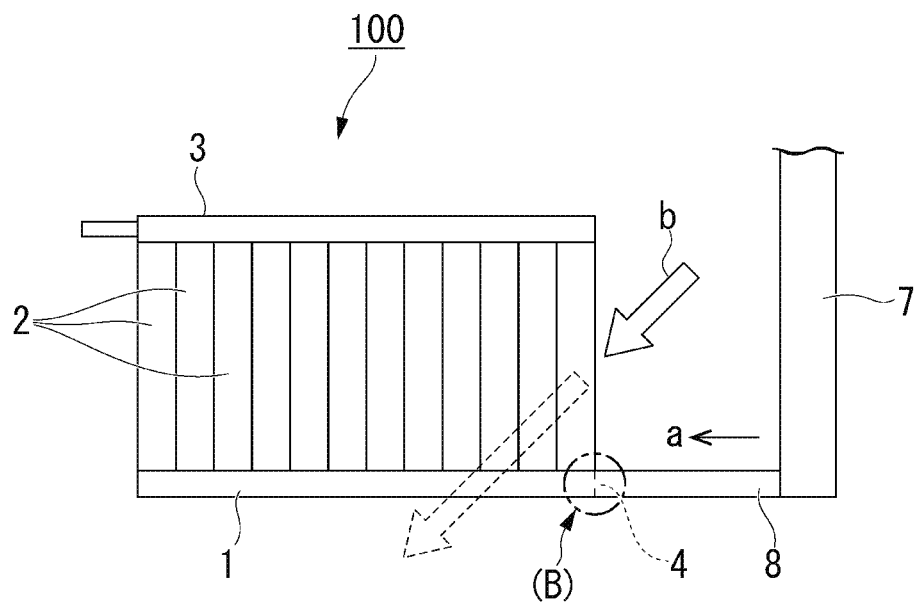
FIG. 1A is a schematic configuration diagram of a front end of a heat exchanger according to the present invention.

As shown in FIG. 1A, the heat exchanger 100 includes a lower header 1 into which a liquid-phase refrigerant C flows, a plurality of heat exchange pipes 2 which branch off from the lower header 1 and extend upwards, and an upper header 3 that collects the refrigerant C received by these heat exchange pipes 2.

Figure 1B:
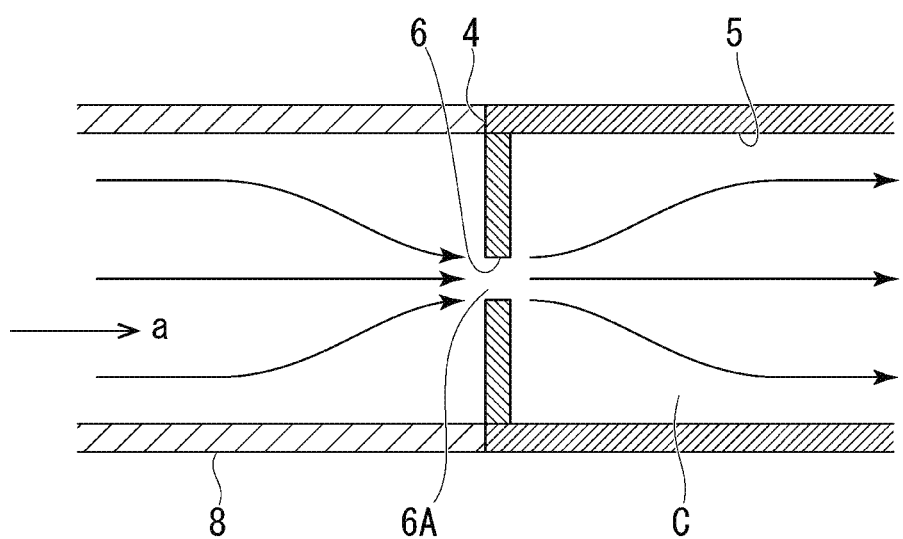
FIG. 1B is an enlarged view of a portion denoted by sign (B) in FIG. 1A.

Further, in the heat exchanger 100, as shown in FIG. 1B, a refrigerant inlet 4 of the lower header 1 is provided with a flow passage resistance adjusting hole 6 having a penetration passage 6A having a flow passage cross-section smaller than a flow passage cross-section of a pipe passage 5 for supplying the refrigerant C.

The refrigerant inlet 4 is formed at one end of the pipe passage 5 in the lower header 1, and branch flow liquid pipes 8 of a manifold 7 supplied with the refrigerant C liquefied by a heat radiating unit (not shown) are connected to the refrigerant inlet 4 with the same central axial line.

Further, in the flow passage resistance adjusting hole 6 of heat exchanger 100 configured as described above, the penetration passage 6A having a flow passage cross-section smaller than the flow passage cross-section of the pipe passage 5 is formed, and thus a pressure loss due to resistance of a flow passage occurs in the refrigerant C with a reduction in the cross sectional area of the flow passage in a case where the liquid-phase refrigerant C passes through the manifold 7 and the branch flow liquid pipe 8 from the heat radiating unit (not shown) as indicated by an arrow (a).

Thereby, in the flow passage resistance adjusting hole 6, it is possible to reduce the pressure of the refrigerant C on a downstream side of the penetration passage 6A. A boiling point of the refrigerant C, that is, the temperature of a phase change from a liquid phase to a gaseous phase falls due to the fall in pressure, and thus it is possible to improve heat removal performance in the heat exchange pipe 2 indicated by an arrow (b).

In addition, the flow passage resistance adjusting hole 6 is disposed inside a flow passage (pipe) which is the refrigerant inlet 4 of the lower header 1 within the heat exchanger 100, and thus it possible to prevent an increase in the size of the apparatus without occupying a space by the heat radiating unit in the vicinity of the pipe and to achieve space saving as a whole.

First Embodiment

A heat exchanger 101 according to a first embodiment of the present invention and a heat exchange system S1 including a plurality of heat exchangers 101 will be described with reference to FIGS. 2 to 4.

Figure 2:
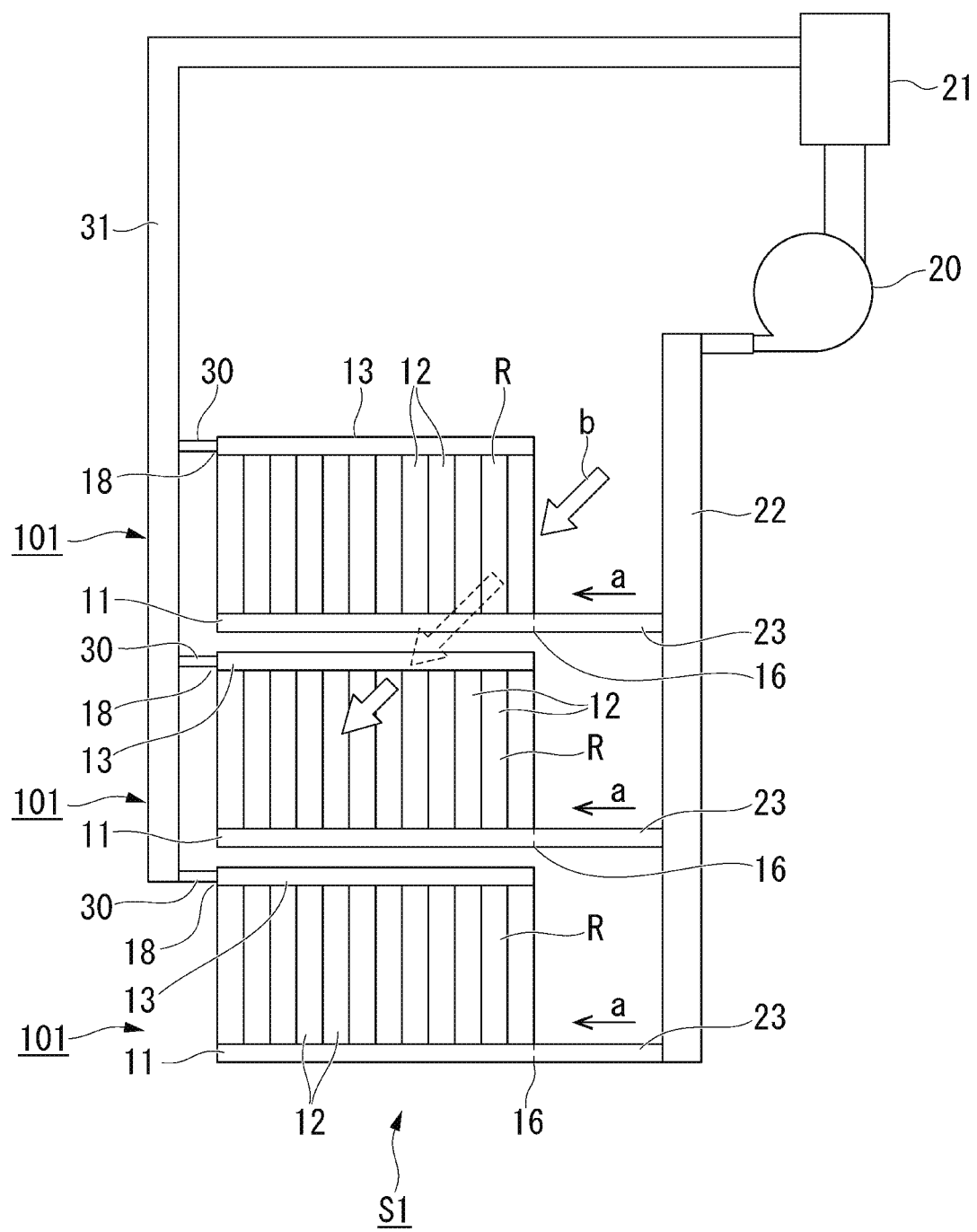
FIG. 2 is a schematic configuration diagram of a heat exchange system according to a first embodiment of the present invention.

As shown in FIG. 2, the heat exchanger 101 of the first embodiment includes lower header 11 into which the liquid-phase refrigerant C flows, a plurality of heat exchange pipes 12 that branch off from the lower header 11 and extend upwards, and an upper header 13 that collects the refrigerant C received by the heat exchange pipes 12.

Among these components, the lower header 11 is disposed so as to extend horizontally at a lower position of the heat exchange pipe 12, and the liquid-phase refrigerant C is supplied to the refrigerant inlet 14 of the lower header 11 through a liquid pipe manifold 22 (to be described later) from the heat radiating unit 21 by a pump 20.

Figure 3:
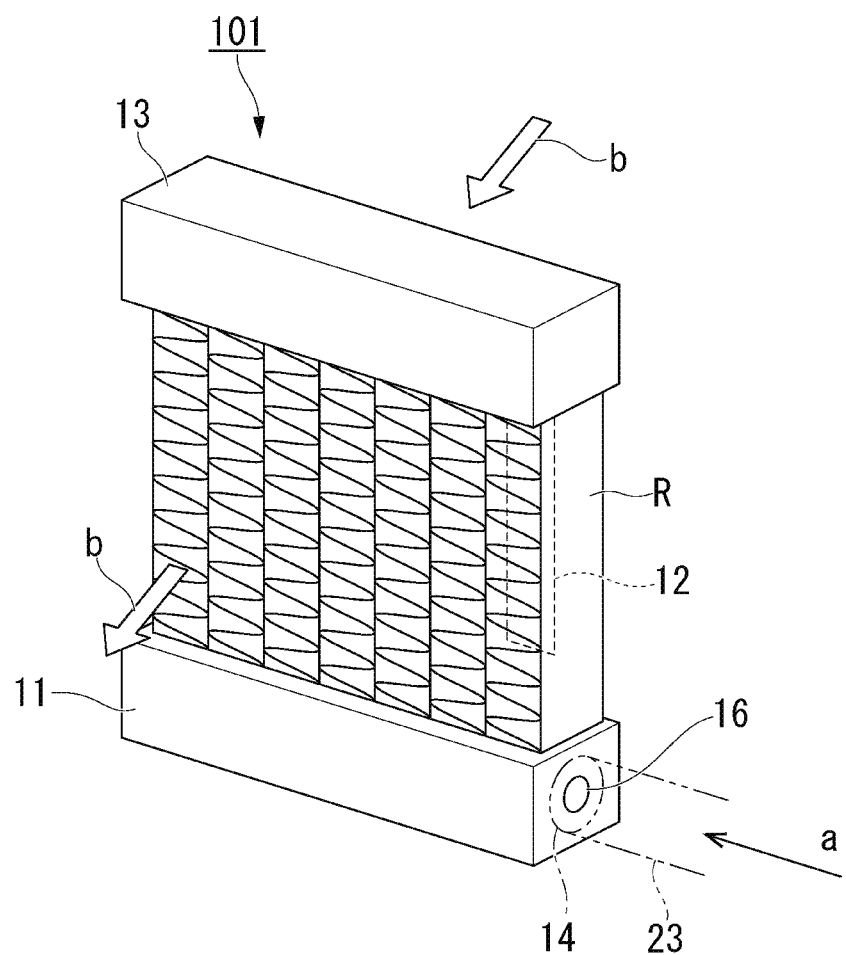
FIG. 3 is a perspective view showing the appearance of a heat exchanger.

As shown in FIG. 3 and Part (A) of FIG. 4, the refrigerant inlet 14 is formed at one end of a pipe passage 15 in the lower header 11, and branch flow liquid pipes 23 of the liquid pipe manifold 22 supplied with the refrigerant C liquefied by the heat radiating unit 21 are connected to the refrigerant inlet 14 with the same central axial line x.

The plurality of heat exchange pipes 12 extends upwards from the lower header 11 and are disposed at intervals in a longitudinal direction of the lower header 11, thereby forming a heat receiving radiator R.

In addition, in the heat exchange pipe 12, as indicated by an arrow (b) in FIG. 3, an exhaust gas of electronic equipment (not shown) is cooled by boiling and vaporizing a liquid-phase refrigerant C inside the heat exchange pipe in a case where the exhaust gas heated by exhaust heat from the electronic equipment is received.

The refrigerant C vaporized by the heat exchange pipe 12 joins the upper header 13, which is disposed so as to extend horizontally at an upper position of the heat exchange pipe 12, and the refrigerant is discharged from a refrigerant outlet 18 (see FIG. 2).

Further, in the heat exchanger 101, the refrigerant inlet 14 of the lower header 11 is provided, with a flow passage resistance adjusting hole 16 having a penetration passage 16A having a flow passage cross-section smaller than a flow passage cross-section of the pipe passage 15 for supplying the refrigerant C.

The flow passage resistance adjusting hole 16 is formed at the center of an orifice plate 17 perpendicular to the central axial line x within a pipe passage 11A of the lower header 11 as shown in Part (A) of FIG. 4, and resistance is generated at the time of passage of the liquid-phase refrigerant C in a case where the refrigerant C is supplied from the heat radiating unit 21 through the liquid pipe manifold 22 by the pump 20 as indicated by an arrow (a).

Part (B) of FIG. 4 shows the state of a flow of a refrigerant C flowing through the orifice plate 17, the branch flow liquid pipe 23 on an upstream of the orifice plate, and the pipe passage 15 on a downstream of the orifice plate, and the direction of the flow as change in a refrigerant pressure P in a direction of an axis line x (a direction of an horizontal axis L). As can see from Part (B) of FIG. 4, in the flow passage resistance adjusting hole 16, it is possible to cause a fall in pressure ($\Delta P$) on a downstream side of the penetration passage 16A of the orifice plate 17, and consequently, a boiling point of the refrigerant C is lowered and it is thus possible to improve heat removal performance in the heat exchange pipe 12.

Further, in the heat exchanger 101, the refrigerant inlet 14 having the flow passage resistance adjusting hole 16 is disposed on one end side of the lower header 11, and the refrigerant outlet 18 from which the refrigerant C is discharged is disposed on the other end side of the upper header 13.

By such arrangement of the refrigerant inlet 14 and the refrigerant outlet 18, a fall in pressure becomes particularly significant at a position immediately below the heat exchange pipe 12 positioned farthest from the refrigerant outlet 18 (the right side in FIG. 2) among the plurality of heat exchange pipes 12, that is, the heat exchange pipe 12 having a tendency to be a flow passage having a large resistance for discharging the refrigerant C and thus have a small amount of heat absorbed, and heat absorption in this heat exchange pipe 12 is promoted, whereby the refrigerant C can be made to uniformly reach the heat exchange pipes 12 as a whole.

Meanwhile, in he present example, the orifice plate 17 is used in order to install the flow passage resistance adjusting hole 16, but a throttle pipe may be used instead of the orifice plate 17.

In addition, the flow passage resistance adjusting hole 16 may have a shape in which the flow passage resistance adjusting hole simply penetrates the orifice plate 17 in a vertical direction and has a diameter gradually decreasing a direction in which the refrigerant C flows. In this case, a corn-shaped member may be installed in the vicinity of the flow passage resistance adjusting hole 16.

Next, the heat exchange system S1 constituting a cooling cycle by including the plurality of heat exchangers 101 configured as described above will be described.

As shown in FIG. 2, the heat exchangers 101 are disposed in a plurality of stages in the vertical direction and disposed in the same plane.

In addition, the branch flow liquid pipes 23 branching off from the liquid pipe manifold 22 are respectively connected to the refrigerant inlets 14 of the respective heat exchangers 101.

In addition, a branch flow gas pipe 30 guiding the vaporized refrigerant C to the heat radiating unit 21 and a vapor pipe 31 joined by the branch flow gas pipe 30 are connected to the refrigerant outlet 18 of each of the heat exchangers 101.

In addition, heat of the vaporized refrigerant C is taken away due to heat exchange with the outside air by the heat radiating unit 21, whereby the refrigerant C is liquefied. Thereafter, the refrigerant C liquefied by the heat radiating unit 21 is returned to the refrigerant inlet 14 of the heat exchanger 101 through the pump 20 and the liquid pipe manifold 22.

That is, in the heat exchange system S1, the refrigerant C sequentially passes through the heat exchanger 101, the vapor pipe 31, the heat radiating unit 21, the pump 20, and the manifold 22, whereby a heat exchange cycle for consecutively performing heat reception from electronic equipment and heat radiation to the outside is formed.

As described above in detail, in the heat exchanger 101 described in the first embodiment, since the flow passage resistance adjusting hole 16 having a flow passage cross-section smaller than the flow passage cross-section of the pipe passage 15 for supplying the refrigerant C is formed in the refrigerant inlet 14 of the lower header 11, resistance is generated in the refrigerant C at the time of passage through the flow passage resistance adjusting hole 16 in a case where the liquid-phase refrigerant C is supplied from the heat radiating unit 21 by the pump 20 as indicated by the arrow (a).

Thereby, in the flow passage resistance adjusting hole 16, it is possible to cause a fall in pressure on the downstream side of the penetration passage 16A, whereby it is possible to improve heat removal performance in the heat exchange pipe 12 by lowering a boiling point of the refrigerant C.

Further, in the heat exchanger 101 described in the first embodiment, the liquid-phase refrigerant C in a state where a phase change most easily occurs due to a sudden fall in pressure in the flow passage resistance adjusting hole 16 is supplied to the heat receiving radiator R, whereby it is possible to minimize a difference in the height of the heat receiving radiator R and performance degradation occurring due to unevenness of a heat load.

In addition, since the flow passage resistance adjusting hole 16 is installed within a pipe system of the refrigerant C, such as the refrigerant inlet 14 of the lower header 11 within the heat exchanger 101, which is inherently required for a heat exchange system, the size of the apparatus is not increased, and thus it is possible to divide a flow of the refrigerant C while achieving space saving as a whole.

Second Embodiment

A heat exchange system S2 according to a second embodiment of the present invention will be described with reference to FIG. 5.

The heat exchange system S2 has a feature that the plurality of heat exchange systems S1 of the first embodiment shown in FIG. 2 are instilled and these heat exchange systems S1 are disposed in parallel.

Meanwhile, the heat exchange systems S1 constituting the heat exchange system S2 are disposed to be dispersed corresponding to electronic equipment to be cooled.

Liquid pipe manifolds 22 of the respective heat exchange systems S1 are connected to a main pipe 40 to which a liquid-phase refrigerant C is supplied from a pump 20.

In addition, a proportional control valve 41 for performing opening and closing a flow passage and adjusting a flow rate is installed at the upper end of the liquid pipe manifold 22 branching off from the main pipe 40.

The proportional control valves 41 disposed in the respective liquid pipe manifolds 22 are individually controlled on the basis of information on any one or a combination of the temperature of an exhaust gas from a cooling target which is supplied to a heat receiving radiator R of the heat exchange system S1, the temperature of air after the exhaust gas is cooled by the heat receiving radiator R, the pressure of the liquid pipe manifold 22 of each heat exchange system S1, a flow rate of a refrigerant flowing to each heat exchange system S1, the power of all servers in a server room which constitute an heat exchange system S1, the temperature of the outside air (in a case where the heat radiating unit 21 is outdoor equipment), and the like so that a flow rate of a refrigerant based on heat loads of the respective heat exchange systems S1 is set.

Further, a junction pipe 32 which the refrigerant C discharged from respective vapor pipes 31 of the heat exchange systems S1 joins, and reaching the heat radiating unit 21 is installed in the heat exchange system S2 according, o the second embodiment.

As described above in detail, in the heat exchange system S2 of the second embodiment, since a flow passage resistance adjusting hole 16 having a flow passage cross-section smaller than a flow passage cross-section of a pipe passage 15 for supplying the refrigerant C is formed in a refrigerant inlet 14 of a lower header 11 of each heat exchanger 101, resistance is generated at the time of passage of the liquid-phase refrigerant C.

Thereby, similarly to the first embodiment, it is possible to cause a fall in pressure on a downstream side of a penetration passage 16A due to the flow passage resistance adjusting holes 16 of the respective heat exchangers 101, whereby it is possible to improve heat removal performance in a heat exchange pipe 12 by lowering a boiling point of the refrigerant C.

In addition, since the flow passage resistance adjusting hole 16 is installed in the refrigerant inlet 14 of the lower header 11 within the heat exchanger 101 which does not occupy a space by the heat radiating unit, the size of the apparatus is not increased, and thus it is possible to divide a flow of the refrigerant C while achieving space saving as a whole.

Further, in the heat exchange system S2 of the second embodiment, since the proportional control valve 41 distributing the refrigerant C to each of the plurality of heat exchange systems S1 is provided in the main pipe 40 to which the refrigerant C from the heat radiating unit 21 is supplied, a flow of the refrigerant C can be controlled so that a flow rate based on heat loads of the respective heat exchange systems S1 is set, whereby it is possible to achieve improvement in heat exchange efficiency.

Third Embodiment

A heat exchange system S3 according to a third embodiment of the present invention will be described with reference to FIG. 6.

The heat exchange system S3 has a feature that a plurality of heat exchangers 101 are disposed in parallel in directions intersecting each other, the heat exchangers being disposed lined up in a vertical direction in FIG. 2 (as if the heat exchangers are aligned in one vertical plane) and each having substantially a flat plate shape as a whole.

That is, each of the heat exchangers 101 constituting the heat exchange system S3 is bent between headers 11 and 13 of the heat exchangers 101 adjacent to each other so as to surround a cooling target form a curved surface approximating to a contour of the cooling target.

With such an arrangement, in the heat exchange system S3 described in the third embodiment, it is possible to efficiently receive heat from electronic equipment which is a cooling target by surrounding the electronic equipment. Meanwhile, in FIG. 6, although the heat exchangers 101 are disposed so as to intersect an air flow indicated by an arrow (b), the heat exchangers 101 may be disposed to cover a cooling target from above in response to a natural convection current in the vicinity of the cooling target.

As described above in detail, also in the heat exchange system S3 of the third embodiment, a flow passage resistance adjusting hole 16 having a flow passage cross-section smaller than a flow passage cross-section of a pipe passage 15 for supplying a refrigerant C is formed in a refrigerant inlet 14 of a lower header 11 of each of the heat exchangers 101, and thus resistance is generated at the time of passage of the liquid-phase refrigerant C.

Thereby, similarly to the first and second embodiments, it is possible to cause a fall in pressure on a downstream side of a penetration passage 16A due to the flow passage resistance adjusting holes 16 of the respective heat exchangers 101, whereby it is possible to improve heat removal performance in a heat exchange pipe 12 by lowering a boiling point of the refrigerant C.

Additionally, in the heat exchange system S3 described in the third embodiment, the heat exchangers 101 are disposed so as to surround electronic equipment which is a cooling target, and thus it is possible to efficiently receive heat from the electronic equipment and to improve operability.

Meanwhile, in the heat exchange system S3 of the present embodiment, the heat exchange system S1 is disposed to surround a portion of the electronic equipment, but the present invention is not limited thereto. The electronic equipment may be surrounded over the entire circumference thereof, so that heat receiving performance from the electronic equipment is further improved.

Although the embodiment of the present invention have been described in detail with reference to the accompanying drawings, specific configurations are not limited to the embodiments, and changes in design and the like within a range not deviating from the gist of the present invention are also included.

INDUSTRIAL APPLICABILITY

The present invention relates to a heat exchanger, a heat exchange system, and a heat exchange method for efficiently receiving heat from electronic equipment.

REFERENCE SIGNS LIST

1 Lower header
2 Heat exchange pipe
3 Upper header
4 Refrigerant inlet
6 Flow passage resistance adjusting hole
11 Lower header
12 Heat exchange pipe
13 Upper header
14 Refrigerant inlet
16 Flow passage resistance adjusting hole
17 Orifice plate
18 Refrigerant outlet
20 Pump
27 Heat radiating unit
22 Manifold
23 Branch flow liquid pipe
100 Heat exchanger
101 Heat exchanger
S1 Heat exchange system
S2 Heat exchange system
S3 Heat exchange system

The invention claimed is:

1. A heat exchanger comprising:
a lower header into which a liquid-phase refrigerant flows;
a plurality of heat exchange pipes which branch off from the lower header and extend upwards; and
an upper header which is configured to collect the refrigerant, which is received by the plurality of heat exchange pipes,
wherein the refrigerant flows in a flow passage in an order of the lower header, the plurality of heat exchange pipes, and the upper header, and
wherein the lower header is provided with a refrigerant inlet located more upstream of the flow passage of the refrigerant than the plurality of heat exchange pipes, and the refrigerant inlet is provided with a flow passage resistance adjusting hole, the flow passage resistance adjusting hole having a cross-section smaller than a flow passage cross-section of a pipe passage for supplying the refrigerant.

2. The heat exchanger according to claim 1, wherein the flow passage resistance adjusting hole is formed in a center of an orifice plate perpendicular to an axis line within the pipe passage of the lower header.

3. The heat exchanger according to claim 1, wherein
the lower header is disposed to extend horizontally at a lower position of the plurality of heat exchange pipes,
the plurality of heat exchange pipes extends upwards from the lower header and is disposed at intervals in a longitudinal direction of the lower header, and
the upper header is disposed to extend horizontally at an upper position of the plurality of heat exchange pipes.

4. The heat exchanger according to claim 2, wherein
the refrigerant inlet having the flow passage resistance adjusting hole is disposed on one end side of the lower header, and
a refrigerant outlet from which the refrigerant is discharged is disposed on another end side of the upper header.

5. A heat exchange system comprising:
a plurality of the heat exchangers according to claim 1,
wherein the plurality of heat exchangers are disposed in a plurality of stages in a vertical direction and are disposed in the same plane.

6. The heat exchange system according to claim 5, wherein branch flow liquid pipes branching off from a liquid pipe manifold are respectively connected to refrigerant inlets of the plurality of heat exchangers.

7. A heat exchange system comprising:
a plurality of the heat exchangers according to claim 1, each of which is configured such that a lower header, a heat exchange pipe, and an upper header are disposed in the same plane,
wherein the plurality of heat exchangers are disposed to surround a cooling target.

8. The heat exchange system according to claim 7, wherein branch flow liquid pipes branching off from a liquid pipe manifold are respectively connected to refrigerant inlets of the plurality of heat exchangers.

9. A heat exchange method comprising:
supplying a liquid-phase refrigerant to a plurality of heat exchange pipes branching off from a lower header located upstream of the plurality of heat exchange pipes; and
collecting refrigerant received by the plurality of heat exchange pipes in an upper header located downstream of the heat exchange pipes,
wherein a pressure of the refrigerant is lowered when the refrigerant flows into the lower header through a refrigerant inlet of the lower header, the refrigerant inlet being located upstream of the lower header and the plurality of heat exchange pipes in a flow passage of the refrigerant.

10. The heat exchange method according to claim 9, wherein a pressure is lowered by making the refrigerant pass through a flow passage having a small cross-sectional area before the refrigerant is supplied to the lower header.

* * * * *